(12) United States Patent
Ordanis

(10) Patent No.: US 9,977,055 B2
(45) Date of Patent: May 22, 2018

(54) ISOLATION INTERFACE FOR AN ELECTRICITY METER AND ELECTRICITY METERING SYSTEM

(71) Applicant: CIRCUITMETER INC., Ajax (CA)

(72) Inventor: Michael Ordanis, Ajax (CA)

(73) Assignee: CIRCUITMETER INC., Ontario (CA)

( * ) Notice: Subject to any disclaimer, the term of this patent is extended or adjusted under 35 U.S.C. 154(b) by 0 days. days.

(21) Appl. No.: 15/033,948

(22) PCT Filed: Nov. 5, 2014

(86) PCT No.: PCT/CA2014/000794
§ 371 (c)(1),
(2) Date: May 3, 2016

(87) PCT Pub. No.: WO2015/066795
PCT Pub. Date: May 14, 2015

(65) Prior Publication Data
US 2016/0274150 A1  Sep. 22, 2016

(30) Foreign Application Priority Data

Nov. 7, 2013 (CA) ..................................... 2832237

(51) Int. Cl.
  *G01R 1/20* (2006.01)
  *G01R 15/14* (2006.01)
  *G01R 22/06* (2006.01)

(52) U.S. Cl.
  CPC ........... *G01R 15/14* (2013.01); *G01R 22/061* (2013.01); *G01R 22/065* (2013.01)

(58) Field of Classification Search
  CPC ........ G01R 31/42; G01R 15/14; G01R 15/08; G01R 15/04; G01R 15/22; G01R 22/10;
(Continued)

(56) References Cited

U.S. PATENT DOCUMENTS 7,656,638 B2   2/2010 Laakso et al.
7,660,682 B2 * 2/2010 Slota ............... G01R 35/04
                                              324/130

(Continued)

FOREIGN PATENT DOCUMENTS

CA       2 645 391 A1    5/2010
DE  20 2004 002 731 U1   5/2004

OTHER PUBLICATIONS

Translation of DE 20 2004002731.*
(Continued)

*Primary Examiner* — Minh N Tang
(74) *Attorney, Agent, or Firm* — Sughrue Mion, PLLC

(57) ABSTRACT

Provided is an isolation interface for isolating, from a Class 1 power circuit, an electricity meter powered by a Class 2 power supply or battery that monitors the Class 1 power circuit. Also provided are, an electrical metering system utilizing the interface. The interface includes an enclosure containing at least one isolation interface circuit including an input for electrical connection to a sensor inductively coupled to the Class 1 power circuit, and an output for electrical connection to the electricity meter. A potential transformer having a primary electrically connected to the input and a secondary electrically connected to the output transforms a signal received from the sensor to an output signal for the electricity meter. The output is electrically isolated from the input, allowing manufacture of the electricity meter as a low voltage appliance with lower manufacturing costs, and protecting the electricity meter against a fault voltage transmitted by the sensor to the interface.

13 Claims, 2 Drawing Sheets

(58) Field of Classification Search
CPC .... G01R 22/061; G01R 22/065; G01R 22/06; H02H 9/04; H02H 9/06; H02H 9/026; H02H 9/042; H02H 9/044
See application file for complete search history.

(56) References Cited

U.S. PATENT DOCUMENTS

| | | |
|---|---|---|
| 2012/0086425 A1 | 4/2012 | Suchoff |
| 2013/0044400 A1 | 2/2013 | Rouaud |
| 2013/0120032 A1* | 5/2013 | Quiquempoix ..... G06F 13/4282 327/142 |

OTHER PUBLICATIONS

Written Opinion of International Searching Authority of PCT/CA2014/000794 dated Feb. 3, 2015.
International Search Report of PCT/CA2014/000794 dated Feb. 3, 2015.

* cited by examiner

ISOLATION INTERFACE FOR AN ELECTRICITY METER AND ELECTRICITY METERING SYSTEM

FIELD OF THE INVENTION

This invention relates to electricity metering systems. In particular, this invention relates to an isolation interface for an electricity meter.

BACKGROUND OF THE INVENTION

Electricity meters are routinely used to measure power and energy consumption. For example, electrical utilities utilize electricity meters to measure energy and power consumption for subscriber billing and power management purposes. Electricity meters can also be designed to measure and record the electrical energy used by one or more specific loads connected to an electrical network, for example the mains power supply in commercial or residential premises. These types of devices can also be designed to measure and record other characteristics of electrical supply and usage such as brownouts and overvoltages, heavy usage intervals, etc.

Many electricity meters are microprocessor-based and are powered by a low voltage adapter, which does not present a significant fire or shock hazard. Such an electricity meter thus forms part of a low-energy power circuit which operates on a "Class 2" power supply and falls into the general class "information technology equipment". For the purposes contained herein the term "electricity meter" shall mean an electricity meter which is powered by a Class 2 power supply or battery. The terms "Class 1 power circuit" and "Class 2 power supply" are defined in the national electrical code.

The safety features required in an appliance powered by a Class 2 power supply are considerably less stringent than those required by an appliance that is powered by a higher voltage "Class 1" power circuit, for example the mains power supply of a commercial or residential premises. A Class 1 power circuit has a sufficiently high voltage and is capable of delivering sufficient energy as to present a significant fire and shock hazard, and any appliance powered by a Class 1 power circuit must be designed so that no single failure will result in a shock or fire hazard. An appliance connected to a Class 1 power circuit may for example be properly grounded with all conductive components suitably insulated against exposure to physical contact (known as a "Class I" appliance), so that either the ground or the insulation will provide protection against electrical shock and fire in case one or the other of these safeguards fails. Alternatively, an appliance connected to a Class 1 power circuit may be double insulated (known as a "Class II" appliance), each layer of insulation providing independent protection against exposure to physical contact, so that in the event that one layer of insulation fails the other layer of insulation will still provide protection against electrical shock and fire. These types of safeguards add considerable cost to the manufacture of the appliance.

An electricity meter, typically powered by a Class 2 power supply in the order of 6V and a few hundred mA, is an example of a Class III appliance. Class III appliances operate at such low voltages that they do not present the same shock and fire hazards as appliances that are connected to a higher voltage Class 1 power circuit. As such, Class III appliances have relatively few safety requirements in comparison to Class I and Class II appliances, which considerably reduces the manufacturing costs of a Class III appliance.

One method in which an electricity meter monitors current in a conductor of a Class 1 power circuit uses milli amp current transformers, which are inductively coupled to the power circuit conductors. Such sensors output low current signals, linearly scaled down and proportional to the current flowing through on the conductor with a maximum current output in the order of 20 mA to 100 mA. When these low current signals are converted to voltages using burden resistors or other means such as a current-to-voltage converter circuit, the maximum voltages are in the order 0.2V to 1.2V and well within the voltage levels of a Class 2 power circuit. However, although it is powered by a Class 2 power supply, because its operation involves inductive components (sensors) that are coupled to a Class 1 power circuit, an electricity meter must be manufactured to the standards of an appliance operating off of a Class 1 power circuit. Even though these sensors are not directly coupled to the power circuit conductor in normal operation, in the event of a fault condition whereby the sensor winding becomes conductively coupled to the conductor being monitored, the sensor conductors feeding the input of the electricity meter would become energized to Class 1 voltage levels, which would in turn energize the electricity meter to Class 1 power circuit voltage levels.

Accordingly, even though an electricity meter operates on a Class 2 power supply and receives low voltage input signals from sensors such as current transformers and voltage transformers to take measurements, there is a possibility that a Class 1 power circuit being monitored may come into conductive contact with a sensor, for example in the case of insulation failure. Therefore, for safety reasons such an electricity meter is treated as though it is part of a Class 1 power circuit, and all safety features required in appliances powered by a Class 1 power circuit are required to be built into the electricity meter even though such safety features are unnecessary in its normal operation.

Compliance with the protective measures required in an appliance connected to a Class 1 power circuit adds considerable cost to the manufacture of an electricity meter. It would accordingly be advantageous to provide an interface which allows an electricity meter to be designed and constructed as an appliance operating in a Class 2 power supply, avoiding the costly protective measures required in appliances that operate as part of a Class 1 power circuit while still complying with all safety requirements.

BRIEF DESCRIPTION OF THE DRAWINGS

In drawings which illustrate by way of example only a preferred embodiment of the invention.

DETAILED DESCRIPTION OF THE INVENTION

Figure 1:
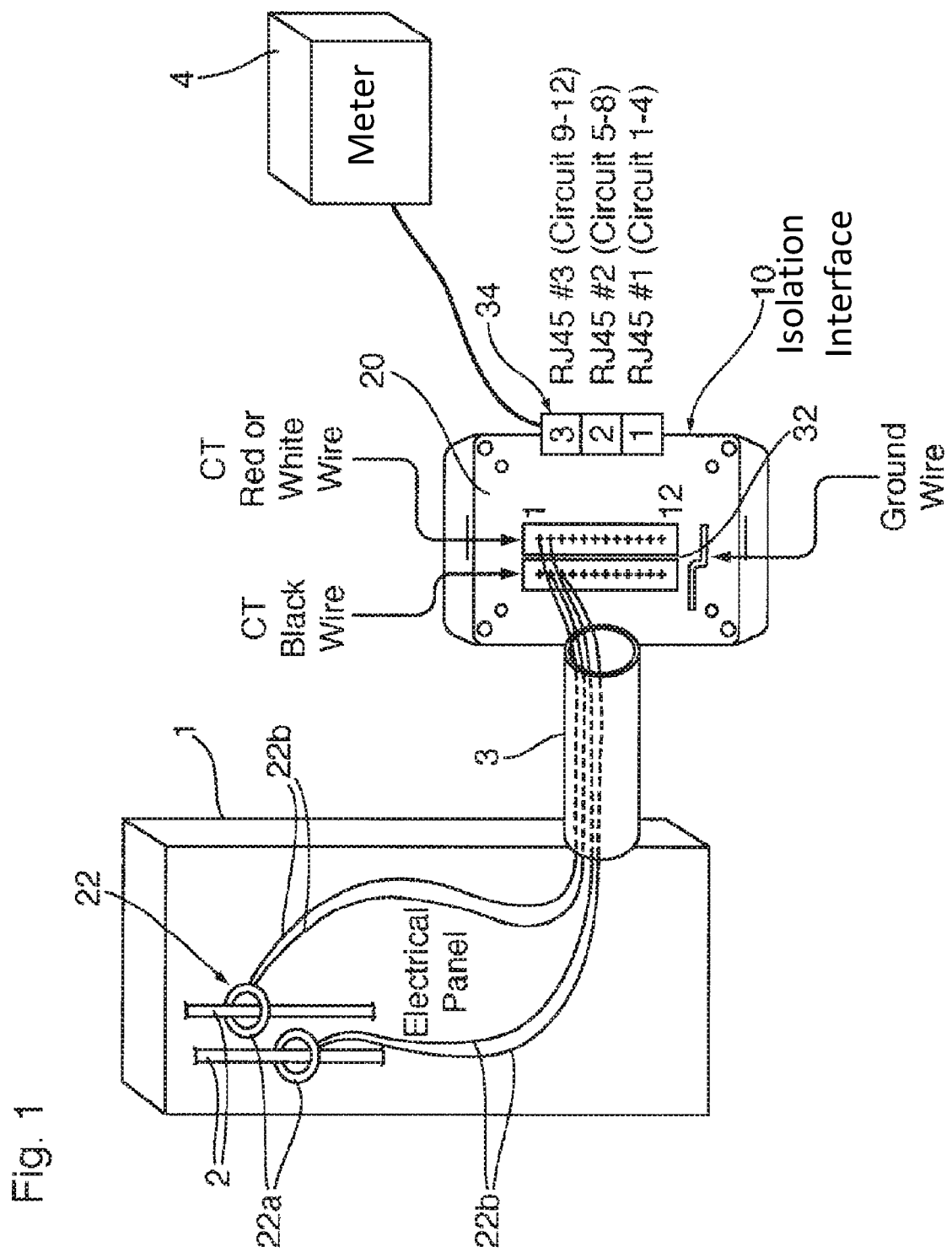
FIG. 1 is a schematic view of an electrical metering system incorporating an embodiment of the isolation interface of the invention.

FIG. 1 illustrates an electrical metering system comprising the isolation interface 10 of the invention. A mains power supply panel 1 contains conductors 2 suitable for a Class 1 power circuit and rated for the maximum current which might be carried in each conductor 2. Sensors, in the embodiment illustrated such as current transformers 22, comprise sensor windings 22a disposed around and inductively coupled to the conductors 2 in conventional fashion, and sensor conductors 22b for transmitting the induced current to an electricity meter 4.

A toroidal type current transformer 22 is shown in the embodiment illustrated, however the principles of the invention apply equally to wound current transformers and voltage transformers. A suitable current transformer 22, by way of example and without limitation, is the solid-core or split-core current transformer manufactured and sold by CircuitMeter Inc. in Canada (www.circuitmeter.com). Any other suitable sensor 22 may be used with the interface 10 of the invention.

Additionally, while the interface 10 of the invention is illustrated in the context of monitoring the current being carried by a conductor 2, the interface 10 may also be advantageously used to monitor a power generation from an electrical power source, for example a photovoltaic panel and inverter, gas generator etc. (not shown).

As is well known, a conventional toroidal current transformer comprises a secondary winding 22a contained within a toroidal insulator, surrounding and spaced from the conductor 2 being monitored which acts as a single-turn primary winding. The current transformer winding 22a is this in inductive communication with, but not conductively coupled to, the conductor 2. An alternating current flowing through the conductor 2 induces an alternating current in the leads 22b of the current transformer winding 22a, which current is linearly scaled down and proportional to the electrical current flowing through the primary (i.e. the conductor 2 being monitored) in accordance with well known principles of electrical transformers. The induced current can be measured in order to calculate the power being consumed via the conductor 2.

Sensor leads 22b from the current transformers 22 as required by the national electrical code are formed from 18 gauge wire with insulation having a UL1015 rating. This ensures that the sensor leads 22b meet the minimum requirements for voltage, temperature and mechanical strength.

The sensor conductors 22b are conductively coupled to the interface 10 in the manner described below. A code-compliant (for example flexible EMT) insulating conduit 3 is provided to safely house the sensor conductors 22b between the panel 1 and the interface 10 and physically isolate them in the event of a fault condition.

FIG. 1 also illustrates an enclosure 20 containing the circuitry for an isolation interface 10 according to the invention. The enclosure 20 illustrated is formed from plastic and double-insulated, and thus compliant for use with Class 1 power supplies. Alternatively (or additionally), the enclosure 20 may be formed from metal and grounded in conventional fashion (not shown).

The interface 10 is interposed in series between the sensors wires 22b and the electricity meter 4. The interface serves to isolate the electricity meter 4 from the Class 1 power circuit containing conductors 2 in the event of a fault condition. The isolation interface 10 of the invention thus passes through to the electricity meter 4 a low-power voltage measurement signal linearly scaled down and proportional to the current flowing through the conductor 2, which may typically be up to about 1.2 VA in the case of conventional milli amp current sensors 22, while isolating the electricity meter 4 from potentially hazardous voltage levels of a Class 1 power circuit in the event of a fault condition.

Any suitable electricity meter 4 may be used, including (by way of non-limiting example only) the electricity meter described and illustrated in the applicant's co-pending U.S. patent application Ser. No. 13/749,896 filed Jan. 25, 2103, which is incorporated herein by reference in its entirety.

Figure 2:
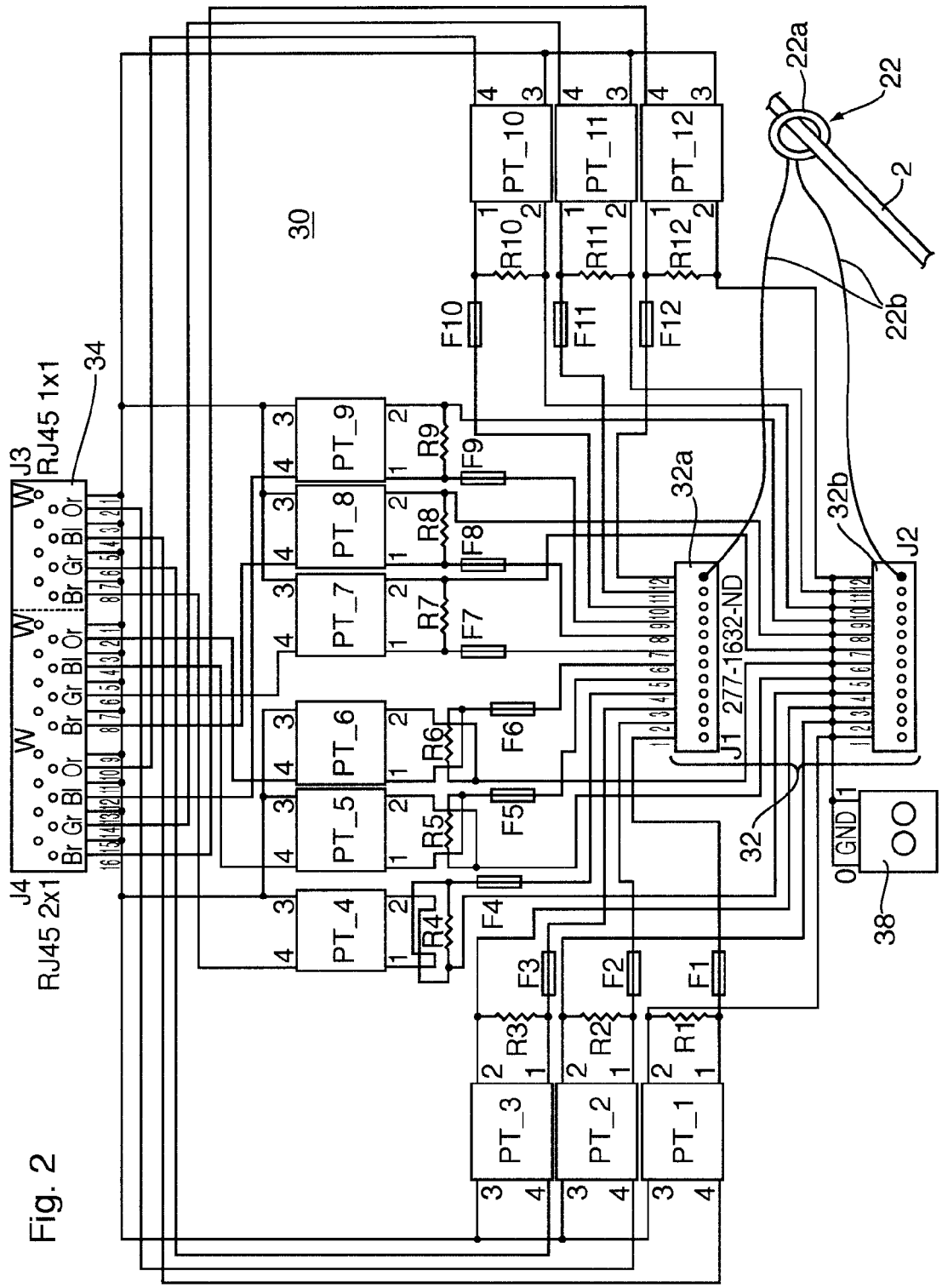
FIG. 2 is a schematic diagram of one embodiment of the isolation interface circuitry.

An embodiment of the circuitry for an interface 10 according to the invention having 12 input and 12 corresponding output connections is illustrated in FIG. 2. The circuitry may be conveniently mounted to a single circuit board 30 and comprises an input connector 32 and an output connector 34. The input connector 32 is shown in FIG. 2 as comprising two separate 12-pin connectors 32a and 32b, each for receiving one of two conductors from a sensor such as current transformer 22. An output connector 34 for connection to the electricity meter 4 conveniently comprises a series of standard RJ45 connectors, each having 8 pins and thus capable of supplying the electricity meter 4 with independent output signals from four different sensors 22.

The embodiment illustrated thus accommodates up to 12 sensors 22, by way of example. However, any other suitable input and/or output connectors can be used, and the number of sensors 22 that can be accommodated is a matter of selection suitable for the intended monitoring system. For example, without limitation, the input connector 32 may be formed as a single connector or as separate 2-pin connectors for each sensor 22, or any combination or permutation thereof. The configuration and number of pins provided by input connector 32 is dictated by the number of circuits to be independently monitored, and thus by the number of sensors 22 required. Similarly, the output connector 34 may be formed as a single connector, or as separate 2-pin connectors for each sensor 22, or any combination or permutation thereof, the configuration and number of pins provided by the output connector 34 similarly being dictated by the number of circuits to be independently monitored.

There may be a practical upper limit to the number of sensors 22 which can be connected to the interface 10, determined by the amount of leakage current from each potential transformer PT when under a condition of high voltage across the primary and secondary of the potential transformers. This leakage current is in the order of micro-amperes, but is cumulative over the number of potential transformers provided and as the upper limit approaches the cumulative leakage may affect the pass-fail results of a high-pot test of interface 10.

Isolation of each sensor 22 from the output connector 34, and thus from the electricity meter, is respectively provided by potential transformers PT_1 through PT_12 (FIG. 2). According to the present invention, the interposition of a potential transformer between the output of the sensor 22 and the input of the electricity meter 4 isolates the electricity meter 4 from fault conditions resulting in high voltage differences across the primary and secondary of the potential transformer without affecting the linearly scaled down proportionality of the sensor output to the conductor 2 during normal operation, i.e. absent a fault condition.

The potential transformers PT_1 through PT_12 can be selected to have a high enough rating that they will not be overloaded by typical sensor current flow to the interface 10. However, smaller potential transformers PT_1 through PT_12 can be used in the interface 10 of the invention, to reduce cost, in which case it is beneficial (although optional) to apply a current-to-voltage converter shunt across the inputs to the respective potential transformers PT_1 through PT_12 which will convert the current from the current sensors 22 to a voltage. This has the effect of diverting a portion of the sensor current around the potential transformer to avoid overloading the potential transformer. For example, in the embodiment illustrated resistors R_1 through R_12 (FIG. 2), which respectively shunt the inputs to the potential transformers PT_1 through PT_12, will convert an excessively high output current from the current sensors 22 to a voltage to reduce the current circulating through the primaries of the respective potential transformers PT_1 through PT_12. Resistors R_1 through R_12 preferably range between 4Ω and 240Ω. This level of resistance provides an acceptable level of burden to the output of current transformer 22 while maintaining the normal range of voltage across the primary and thus the secondary of the potential transformer to Class 2 voltage levels. This safeguard can be implemented by applying any other current-to-voltage converter circuit as a shunt across the inputs to the respective potential transformers PT_1 through PT_12.

In the event of a momentary fault which energizes either or both conductors 22b with the higher Class 1 mains voltage, the isolation provided by the potential transformers provides a level of protection against damage to the electricity meter 4 inputs and against a shock hazard to the human user. The potential transformers PT_1 to PT_12 thus respectively provide a level of protection to the various inputs of the electricity meter 4 and a human user from the higher voltage of a transient power surge or inadvertent conductive coupling of the sensor 22 to the conductor 2.

In the embodiment illustrated, the input connector 32 also provides fused terminals via 12-pin connector 32a, each for connection to one of the two conductors 22b from each of the 12 current transformers 22. Fuses F_1 through F_12 are respectively interposed between the sensor input terminals and primary pin 1 of each potential transformer PT_1 to PT_12. In the event of a transient power surge or momentary fault condition energizing the sensor conductors 22b with a voltage higher than the nominal operating voltage of the sensors 22, the potential transformers PT_1 to PT_12 will isolate the electricity meter 4 inputs from these faults. However, if the power surge or fault results in a current in the primary winding of the potential transformer that exceeds the rating and latency of the fuse F, which may for example be 1.25 A, the fuse F will blow to protect the potential transformer PT from overheating and possible damage or destruction. The other sensor conductor 22b in each sensor conductor pair is directly coupled to primary pin 2 of the one of the potential transformers PT_1 to PT_12, and preferably grounded as at 38. In the event that this conductor becomes energized with mains voltage by any circuit within panel 1, the breaker of the associated circuit will trip because it is coupled directly to ground.

Output pins 3 and 4 of each potential transformer PT_1 to PT_12 are directly coupled to corresponding pins in output connector 34. The inputs of an electricity meter 4 connected to the interface 10 thus receive independent voltage signals, from one or more of the 12 separate isolation circuits shown in FIG. 2, linearly scaled down and proportional to the current flowing through each respective conductor 2 being monitored by a sensor 22 connected to the corresponding input of the isolation interface 10. The electricity meter 4 measures the potential transformer PT output signals to calculate the power flowing through the respective power conductors 2, either directly, in the case of an analog electricity meter 4, or in the case of a digital electricity meter 4, through analog-to-digital converters built into the input stage of the electricity meter 4. The secondary side of each potential transformer PT is isolated from potential fault voltages and power spikes in the power conductors 2, which both protects any delicate circuitry in the electricity meter 4 from overvoltages and permits the electricity meter 4 to be designed and constructed as an appliance operating within a Class 2 power supply, with attendant cost savings by avoiding the much more rigorous safety measures mandated for appliances operating within a Class 1 power circuit.

In operation, a sensor 22 such as a current transformer is inductively coupled to a conductor 2 being measured. A single sensor 22 connected to input 12 of input connector 32 is illustrated in FIG. 2 by way of example. The current transformer 22 may be a solid core current transformer, for example in new installations where the conductors 2 can be inserted through the current transformer secondary 22a prior to connection; or may be a split core current transformer, which is advantageously used to retrofit a power monitoring system to an existing installation because the core can be mounted around the conductor 2 without having to disconnect the conductor 2.

The sensor winding 22a is coupled to the pair of input ports 32a, 32b via sensor leads 22b. Each current transformer 22 has a polarity which is determined by its orientation around the conductor 2, as is well known, and this polarity should be respected as between the different current sensors 22 connected to the interface 10 in order to avoid anomalous readings by the electricity meter 4. An alternating current flowing through the conductor 2 induces a current in the sensor secondary 22a linearly scaled down and proportional to the current flowing through the conductor 2, typically to a maximum of about 20 mA to 100 mA. The induced current is transmitted through the sensor leads 22b to the input connector 32 and coupled to input pins 1 and 2 of potential transformer PT_12 and pins of R12. The potential transformer PT_12 permits the alternating voltage generated across R12 to be inductively coupled to the outputs 3 and 4 and then on to the input of the electricity meter 4.

In the event of a transient fault condition, for example where the current transformer winding 22a comes into conductive contact with the conductor 2, the current transformer leads 22b become energized to the conductor 2 voltage level. The potential transformer PT_12 isolates the fault from the electricity meter 4, thus preventing damage to the electricity meter 4 and protects a human user in contact with the electricity meter 4. If the fault overvoltage exceeds the limit and latency of the fuse F_12, the fuse F_12 will blow to protect the potential transformer PT_12 from overheating and potential burnout of its primary.

At least one embodiment of the present invention having been described in detail by way of example, it will be apparent to those skilled in the art that variations and modifications may be made without departing from the invention. The invention includes all such variations and modifications as fall within the scope of the claims.

The invention claimed is:

1. An isolation interface for isolating, from a Class 1 power circuit, an electricity meter which is powered by a Class 2 power supply or battery and that is monitoring the Class 1 power circuit, the isolation interface, comprising:
   an enclosure, for containing isolation interface circuitry,
   at least one isolation interface circuit comprising
      an input for electrical connection to a current sensor inductively coupled to the power circuit, and
      an output for electrical connection to the electricity meter, and
   a potential transformer having a primary electrically connected to the input and a secondary electrically connected to the output, for transforming a signal from the current sensor to a signal for the electricity meter, whereby the output is electrically isolated from the input such that the electricity meter is protected against a fault voltage transmitted by the current sensor to the interface.

2. The isolation interface of claim 1 comprising a current-to-voltage converter circuit applied between inputs to the primary, for diverting sensor current in whole or in part from entering the potential transformer, to avoid overloading the potential transformer.

3. The isolation interface of claim 2 wherein the current-to-voltage converter circuit comprises a resistor.

4. The isolation interface of claim 1 wherein a fuse and grounding wire is interposed between the current sensor and the potential transformer primary.

5. The isolation interface of claim 1 comprising a plurality of isolation interface circuits.

6. An electrical metering system, comprising
an electricity meter which is powered by a Class 2 power supply or battery, and
an isolation interface for isolating the electricity meter from a Class 1 power circuit being monitored by the electricity meter, comprising
an enclosure, for containing isolation interface circuitry,
at least one isolation interface circuit comprising an input for electrical connection to a current sensor inductively coupled to the power circuit, and
an output for electrical connection to the electricity meter, and
a potential transformer having a primary electrically connected to the input and a secondary electrically connected to the output, for transforming a signal from the current sensor to a voltage for the electricity meter,
whereby the output is electrically isolated from the input such that the electricity meter is protected against a fault voltage transmitted by the current sensor to the interface.

7. The electrical metering system of claim 6 wherein a fuse and grounding wire is interposed between the current sensor and the potential transformer primary.

8. The electrical metering system interface of claim 6 comprising a current-to-voltage converter circuit applied between inputs to the primary, for diverting sensor current in whole or in part from entering the potential transformer, to avoid overloading the potential transformer.

9. The electrical metering system of claim 8 wherein the current-to-voltage converter circuit comprises a resistor.

10. The electrical metering system of claim 6 comprising a plurality of isolation interface circuits.

11. A method of monitoring a Class 1 power circuit via an electricity meter which is powered by a Class 2 power supply or battery, comprising, in any order, the steps of:
 a. inductively coupling at least one current sensor to the Class 1 power circuit,
 b. coupling the at least one current sensor to a primary of a potential transformer contained within an enclosure, and
 c. coupling a secondary of the potential transformer to an input of the electricity meter,
 whereby the electricity meter is electrically isolated from the current sensor so that the electricity meter is protected against a fault voltage transmitted by the current sensor to the potential transformer primary.

12. The method of claim 11 comprising, at any time before step c., the step of applying a current-to-voltage converter circuit between inputs to the primary, for diverting sensor current in whole or in part from entering the potential transformer, to avoid overloading the potential transformer.

13. The method of claim 12 wherein the current-to-voltage converter circuit comprises a resistor.

* * * * *